United States Patent
Song

(10) Patent No.: US 6,912,677 B2
(45) Date of Patent: Jun. 28, 2005

(54) CIRCUIT FOR INSPECTING A DATA ERROR

(75) Inventor: Dae Sik Song, Kyungki-Do (KR)

(73) Assignee: Hynix Semiconductor Inc., Gyunggi-do (KR)

(*) Notice: Subject to any disclaimer, the term of this patent is extended or adjusted under 35 U.S.C. 154(b) by 413 days.

(21) Appl. No.: 10/294,202

(22) Filed: Nov. 14, 2002

(65) Prior Publication Data

US 2003/0106000 A1 Jun. 5, 2003

(30) Foreign Application Priority Data

Dec. 3, 2001 (KR) .................................. 2001-75872

(51) Int. Cl.⁷ .............................................. G11C 29/00
(52) U.S. Cl. ...................................... 714/718; 714/54
(58) Field of Search ........................... 365/201, 230.03; 714/703, 733, 742, 718, 54

(56) References Cited

U.S. PATENT DOCUMENTS

| 5,511,029 A | * | 4/1996 | Sawada et al. | ............. 365/201 |
| 5,587,950 A | * | 12/1996 | Sawada et al. | ............. 365/201 |
| 5,959,930 A | * | 9/1999 | Sakurai | ................. 365/230.03 |
| 6,735,729 B1 | * | 5/2004 | Merritt et al. | ............... 714/718 |
| 6,816,422 B2 | * | 11/2004 | Hamade et al. | ............. 365/201 |

* cited by examiner

Primary Examiner—David Ton
(74) Attorney, Agent, or Firm—Marshall, Gerstein & Borun LLP

(57) ABSTRACT

A circuit for inspecting a data error is described herein. The circuit for inspecting a data error comprises a clock buffer, a buffer unit, a latch unit, a decoder, a compression unit, a counter, a data bus signal latch unit, and a select unit.

6 Claims, 9 Drawing Sheets

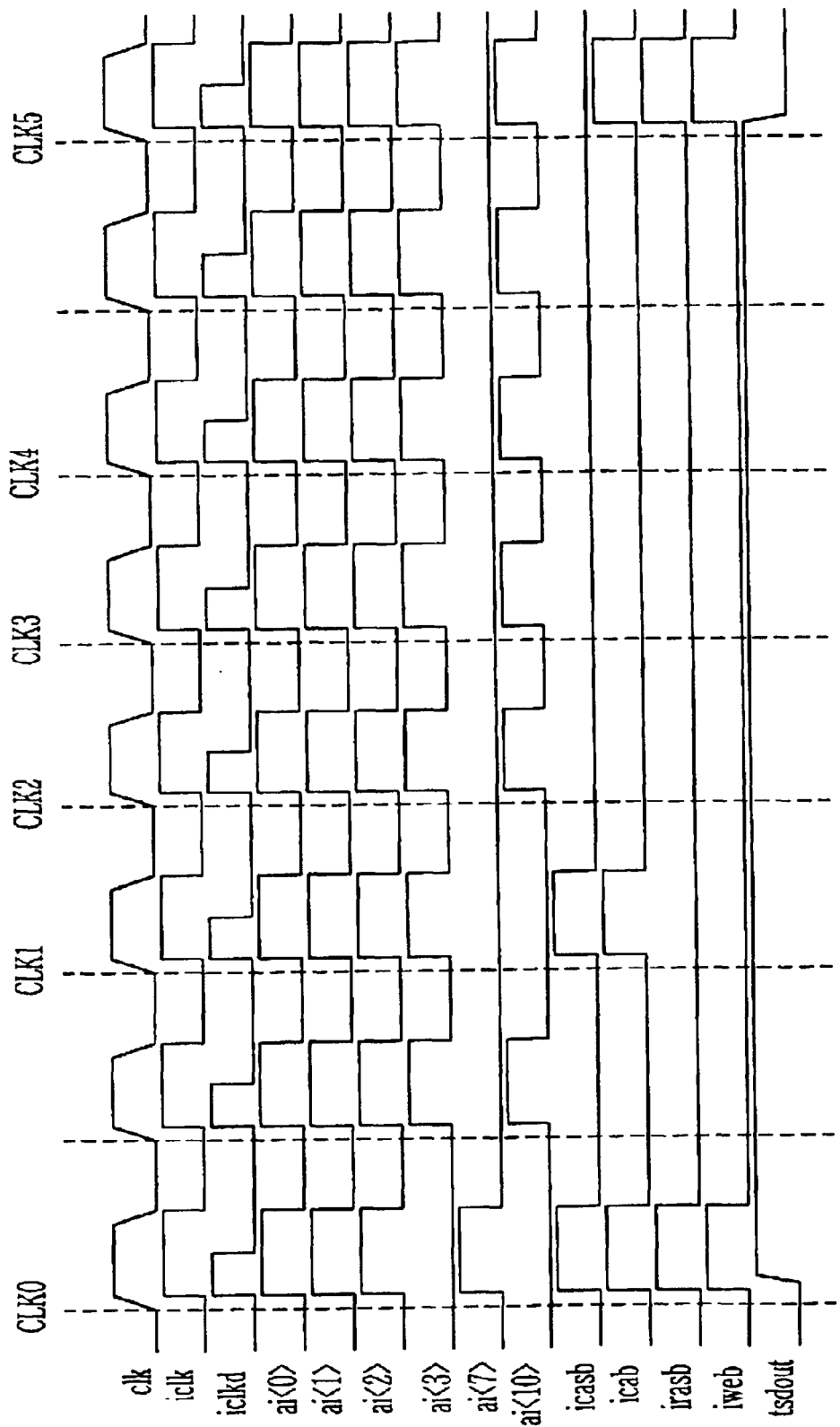

CIRCUIT FOR INSPECTING A DATA ERROR

TECHNICAL FIELD

The present disclosure relates generally to a circuit for inspecting a data error, and more particularly, to a circuit for inspecting a data error that is applied to implement a test mode of a synchronous DRAM (SDRAM) configured to inspect error of each of a plurality of bit data through one bit data line.

BACKGROUND

Generally, as a method for compressing data of several bits into one bit data can inspect error of data of several bits using data of one bit physically, the inspection time and bit number can be reduced. Thus, this method is spotlighted as a method of testing a DRAM. A data compression method is mainly employed to inspect data of multiple bits using a data line of one bit.

Referring now to FIG. 1, a conventional circuit for inspecting a data error is described. A clock buffer 1 transfer a clock signal CLK inputted from the outside to a latch unit 3. A buffer unit 2 transfers a row address select signal/RAS, a column address select signal/CAS, a write enable signal /WE, a chip select signal/CS, a clock enable signal CKE and address signals AN<0:m>, all of which are inputted from the outside, to a DRAM. Based on the clock signal iclk outputted from the clock buffer 1, the latch unit 3 synchronizes an output signal of the buffer unit 2 for receiving the signals /RAS, /CAS, /WE, /CS, CKE and AN<0:m>. At this time, the clock signal iclk is a signal that becomes a HIGH level when the clock signal CLK becomes a HIGH level. The clock signal iclk may become a LOW level when the clock signal CLK becomes a LOW level or a LOW level because of a certain delay within the DRAM.

Each of the signals irasb, icasb, iweb and icsb outputted from the latch unit 3 becomes a HIGH level when the signals /RAS, /CAS, /WE and /CS become LOW levels. Each of the signals Ai<0:m> becomes a LOW level when the signals AN<0:m> become LOW levels.

FIG. 2 is a circuit diagram of the decoder 4 shown in FIG. 1. The inverter I1 inverts a signal icasb from the latch unit 3 to output an inverted signal icas.

The signals irasb, icasb, iweb and icsb from the latch unit 3 are inputted into a NAND gate G1. A NAND gate G2 may receive the output signal of the NAND gate G1, which is inverted by the inverter I2, and the address signal Ai<10> to output a reset signal reset.

The address signals Ai<0>, Ai<1>, Ai<2> and Ai<3> from the latch unit 3 are inputted to a NAND gate G3. The signals irasb, icasb, iweb and icsb from the latch unit 3 are inputted to a NAND gate G5. Also, an inverted signal of the NAND gate G5, which is inverted by the inverter I4, and an address signal Ai<7> are inputted to a NAND gate G6. Further, an output signal of the inverter I3 and an output signal of the NAND gate G6, which is inverted by the inverters I5, I6 and I7, are inputted into a NAND gate G4. A signal outputted from the NAND gate G4 is outputted to an output terminal tcomp through a latch circuit having NAND gates G7 and G8.

The decoder 4 described above operates so that an output signal tcomp of the decoder 4 becomes a HIGH level when the signals irasb, icasb, iweb, icsb, Ai<7>, Ai<0>, Ai<1>, Ai<2>, Ai<3>, or the like from the latch unit 3 are HIGH levels. The output signal tcomp becomes a LOW level when the signals irasb, iweb, icsb, Ai<10>, and the like are HIGH levels and the signal icasb is a LOW level. The decoder 4 operates in a data compression mode when the output signal tcomp is a HIGH level.

Although, a signal that is decoded to control the output signal tcomp is shown in FIG. 2, persons of ordinary skill in the art will readily appreciate that a decoding of another mode is possible.

FIG. 3 is a detailed circuit diagram of the compression unit 6 shown in FIG. 1. The signals gio<0> to gio<n> transferred through a data bus are inputted to a NAND gate G9 and the NOR gate G10. An output signal of the NAND gate G9 through the inverters I8 and I9, an output signal of the NOR gate G10 through the inverter I10, and the output signal tcomp of the decoder 4 are inputted to the NAND gate G11. A signal rdbc is outputted from the NAND gate G11.

The output signal rdbc becomes a HIGH level when the output signal tcomp of the decoder 4 is a HIGH level, and the signals gio<0:n> transferred through the data bus within the DRAM are HIGH levels or LOW levels. For all the case except for the above, the output signal rdbc becomes a LOW level (e.g., the output signal tcomp of the decoder 4 is a LOW level).

FIG. 4 is a detailed circuit diagram of the select unit 5 shown in FIG. 1. A signal gio<k> and a compressed signal rdbc are transferred to the data line rdb through the transmission means T1 and T2 that are driven by the output signal tcomp of the decoder 4 and an inverted signal tcompb.

When the output signal tcomp of the decoder 4 is a HIGH level, the signal rdbc outputted from the compression unit 6 is transferred to the one bit data line rdb. When the output signal tcomp of the decoder 4 is a LOW level, one signal gio<k> of the signals gio<0:n> transferred through the data bus is transferred to the data line rdb. As a result, in the data compression test mode, the signals gio<o:n> transferred through the data bus are compressed to become the signal rdbc, which in turn, is transferred to the data line rdb. For all other modes, the signal gio<k> is transferred to the data line rdb.

As noted above, when the signal rdbc compressed through the compression unit 6 does not contain information on the signals gio<0:n> and when the signal rdbc is a LOW level, it is difficult to determine which signal of the data bus signals gio<0:n> is a HIGH level and which is a LOW level using only the signal rdbc. In other words, in an error inspection test situation in which only the signal rdb being one bit data is outputted from the DRAM, it is difficult to determine which signal of the data bus signals gio<0:n> has an error. To inspect which signal of the data bus signals gio<0:n> has an error, there is an error inspecting environment by which the signals rdb of n bit corresponding to the signals gio<0:n>, respectively, are output from the DRAM to inspect an error.

The conventional error inspecting circuit does not contain data information of respective bits in data transferred through the data line of one bit. Accordingly, if an error of data occurs, it is difficult to determine which data has an error. As a result, in a test environment of DRAM using a conventional data compression method, there is a need for a test environment by which each of data of several bits can be inspected for error.

SUMMARY OF THE DISCLOSURE

A circuit for inspecting a data error in which information on each of N bit data is transferred to a data transferred through a data line of one bit is disclosed.

The circuit for inspecting a data error comprises a clock buffer for receiving a clock signal from the outside; a buffer unit for receiving a plurality of operation control signals and an address signal from the outside; a latch unit for synchronizing the plurality of the operation control signals and the address signal from the buffer unit depending on the clock signal from the clock buffer; a decoder for receiving the plurality of the operation control signals and the address signal from the latch unit to output a data compression signal, a first signal, and a second signal; a compression unit for compressing the data bus signal depending on the data compression signal from the decoder; a counter for sequentially generating count pulses depending on the clock signal from the clock buffer, and the first signal and the second signal from the decoder; a data bus signal latch unit having a latch for storing the data bus signal depending on the first signal from the decoder, for outputting a signal stored at the latch depending on the count pulse from the counter; and a select unit for selectively outputting one of an output signal of the data bus signal latch unit, a signal from the compression unit and the data bus signal, depending on the data compression signal and the second signal outputted from the decoder.

The decoder includes a first logic means for logically combining the plurality of the operation control signals and the address signal from the latch unit to generate a reset signal; a second logic means for logically combining the plurality of the operation control signals from the latch unit; a delay means for delaying a signal from the second logic means to generate a first signal; a third logic means for logically combining the address signal from the latch unit; a fourth logic means for logically combining the plurality of the operation control signals and the address signal from the latch unit and then delaying the logically combined signals; a fifth logic means for logically combining the address signal from the latch unit; and a sixth logic means for generating the data compression signal and the second signal depending on a signal from the third, fourth and fifth logic means and the reset signal.

The counter includes a delay means for delaying a clock signal from the clock buffer; a logic means for logically combining the first and second signals from the decoder and the clock signal from the delay means to generate first, second and third signals; and a count pulse generator for generating a count pulse depending on the first, second and third signals.

The data bus signal latch unit includes a logic means for generating first and second signals of opposite state each other using the first signal from the decoder; a plurality of inverters for inverting each of the plurality of the count signals outputted from the counter; a plurality of latch means for latching each of the data bus signals depending on the first and second signals from the logic means; and a plurality of transfer means for transferring the data bus signals latched in the latch means to the output terminal, depending on a count signal from the counter and an inverted count signal from the inverter.

The select unit includes a first transfer means for an output signal of the data bus signal latch unit to the output terminal depending on the second signal and the inverted second signal; a first logic means for logically combining the data compression signal and the inverted second signal; a second transfer means for transferring an output signal of the compression unit to the output terminal depending on an output signal of the first logic means and an inverted output signal of the first logic means; a second logic means for logically combining the data compression signal and the second signal; and a third transfer means for transferring the data bus signal to the output terminal depending on an output signal of the second logic means and an inverted output signal of the second logic means.

BRIEF DESCRIPTION OF THE DRAWINGS

This disclosure will be described in terms of several embodiments to illustrate its broad teachings. Reference is also made to the attached drawings.

FIG. 10A and FIG. 10B are a timing diagram of an operation of the data error inspecting circuit.

DETAILED DESCRIPTION

Figure 1:
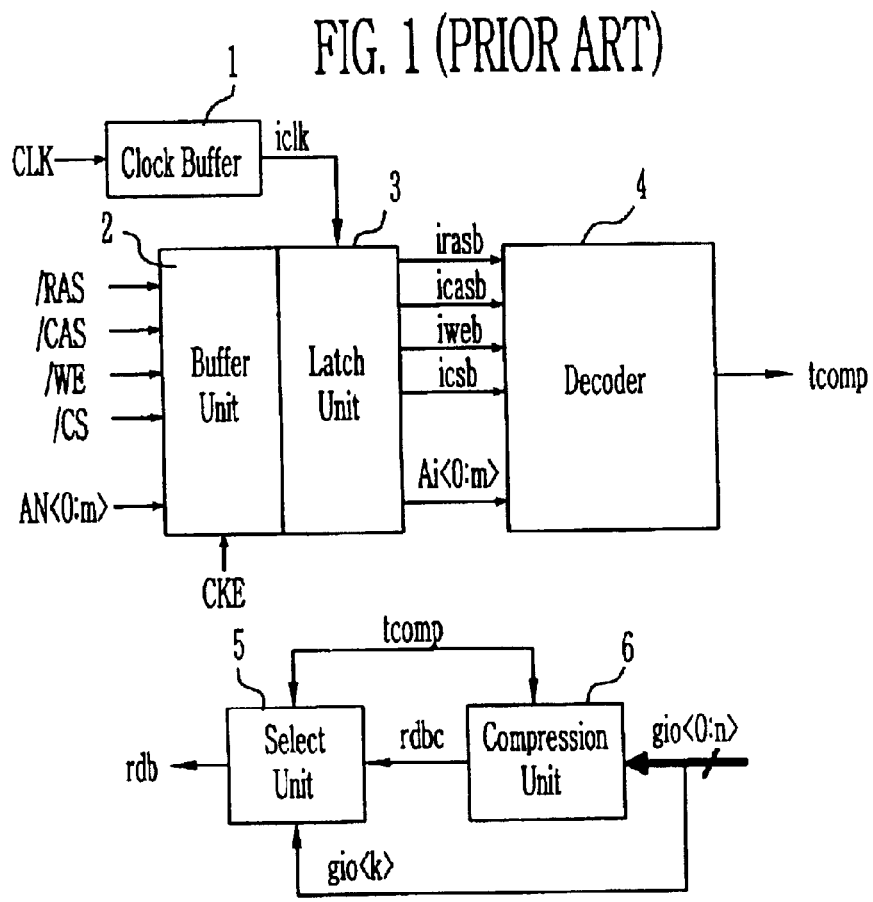
FIG. 1 is a block diagram of a conventional data error inspecting circuit.
Figure 2:
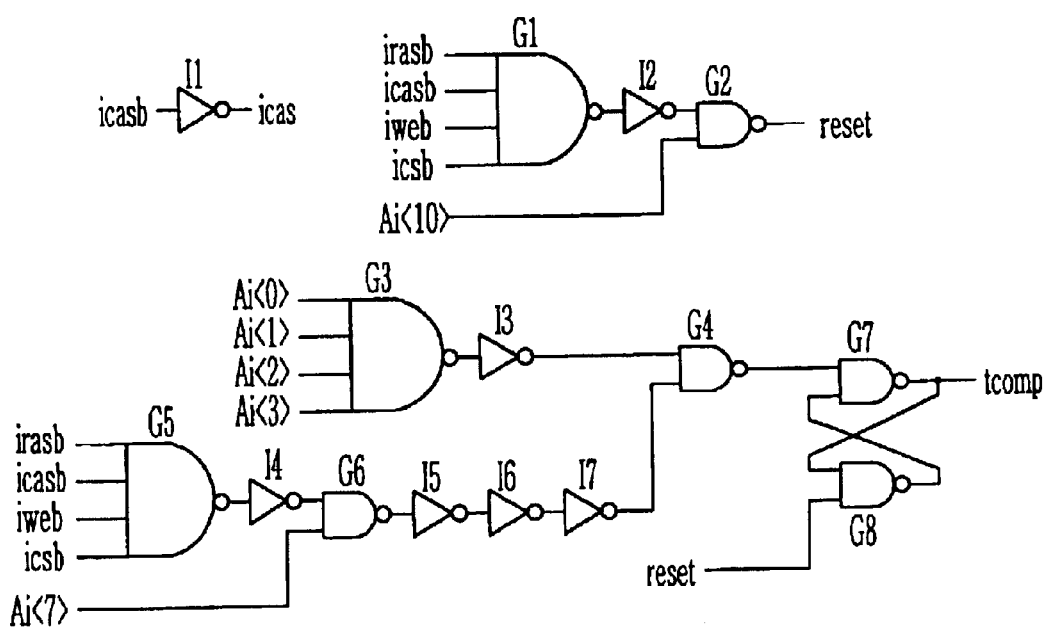
FIG. 2 is a detailed circuit diagram of a decoder shown in FIG. 1.
Figure 3:
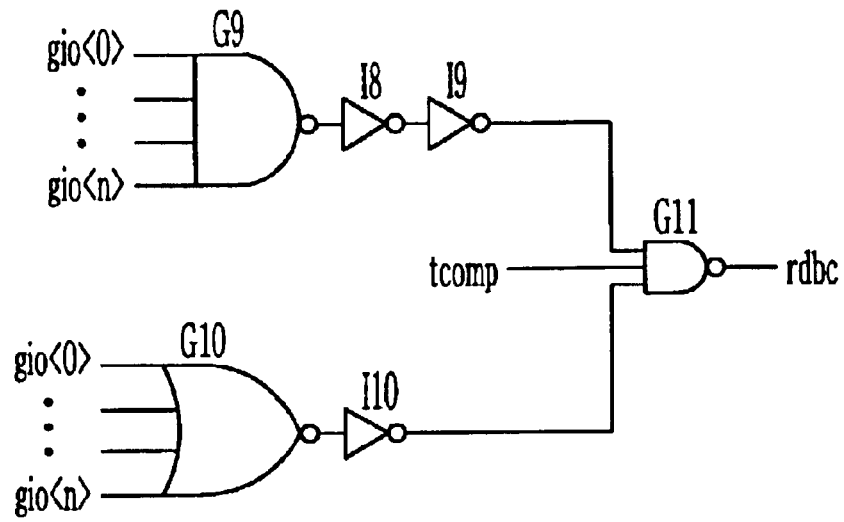
FIG. 3 is a detailed circuit diagram of a compression unit shown in FIG. 1.
Figure 4:
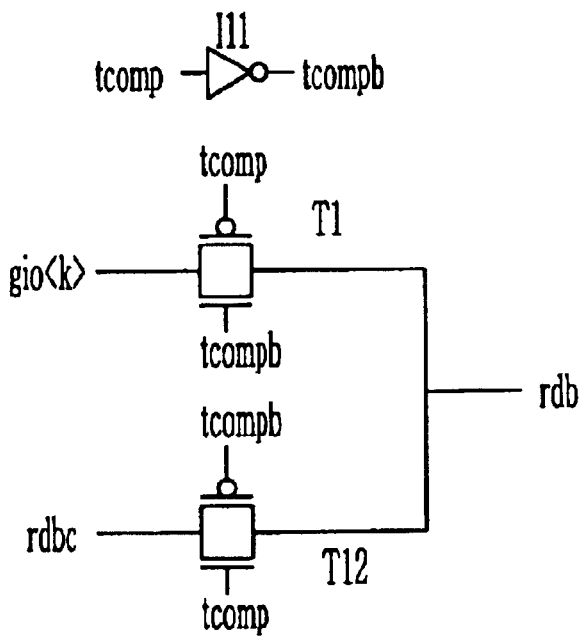
FIG. 4 is a detailed circuit diagram of a select unit shown in FIG. 1.

The present disclosure will be described in detail by way of a preferred embodiment with reference to accompanying drawings, in which like reference numerals are used to identify the same or similar parts.

To solve problems inherent in the conventional data compression method, data of a N bit is sequentially transferred through a data line of one bit. A test mode is implemented by which information of each of N bit data can be transferred to data transferred through the data line of one bit. Therefore, the an error of each of data of plural bits can be inspected with only data transferred through the data line of one bit without additional test environment.

Figure 5:
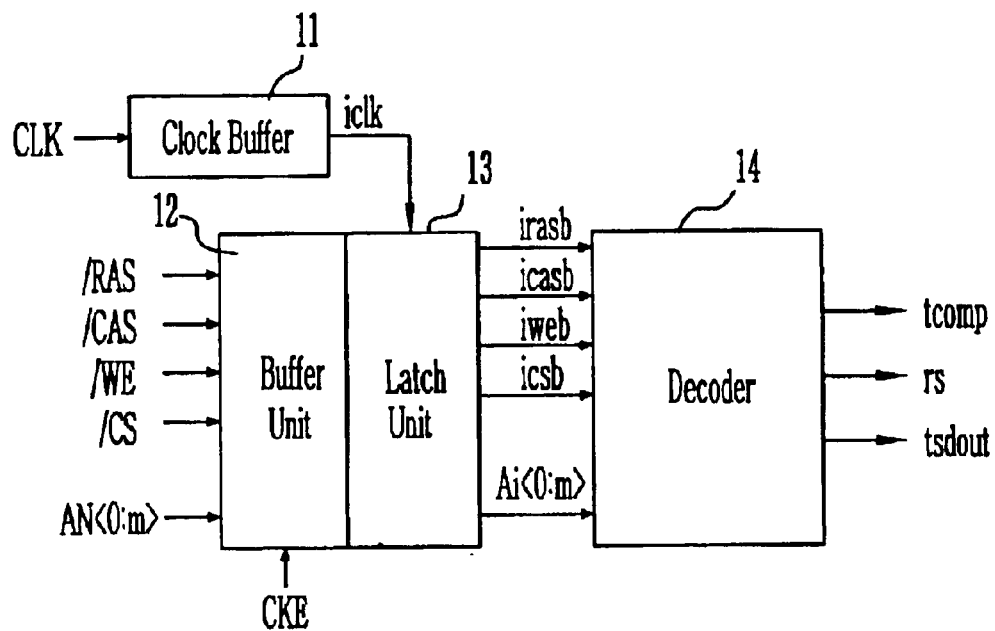
FIG. 5 is a block diagram a circuit for inspecting a data error.
Figure 5:
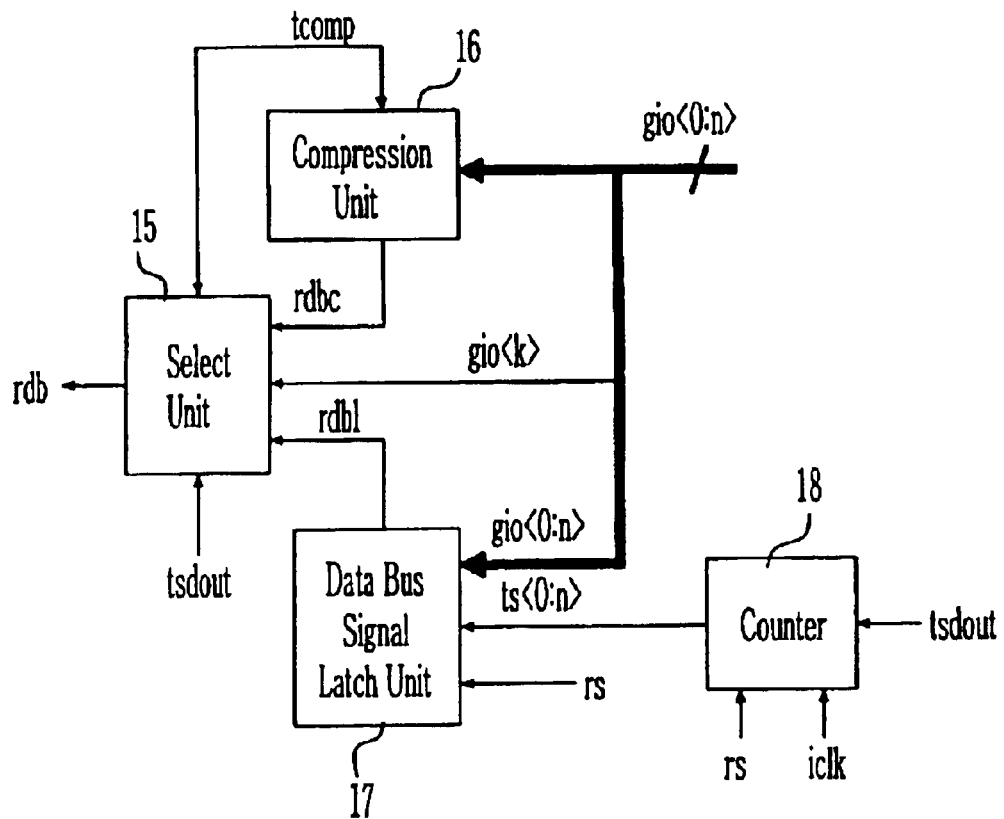

Referring now to FIG. 5, a circuit for inspecting a data error is shown. A clock buffer 11 transfers a clock signal CLK from the outside. A buffer unit 12 receives a plurality of operation control signals: a row address select signal/RAS, a column address select signal/CAS, a write enable signal/WE, a chip select signal/CS, a clock enable signal CKE and address signals AN<0:m>. The latch unit 13 synchronizes the plurality of the operation control signals and an address signal from the buffer unit 12 depending on a clock signal iclk outputted from the clock buffer 11.

A decoder 14 receives the plurality of the operation control signals irasb, icasb, iweb and icsb, and the address signals Ai<0:m> from the latch unit 13 to output a data compression signal tcomp, a signal rs and a signal tsdout. The compression unit 16 compresses the data bus signals gio<0:n> depending on the data compression signal tcomp from the decoder 14. The counter 18 sequentially generates count pulses ts<0:n> depending on the clock signal iclk from the clock buffer 11, and the signal rs and the signal tsdout from the decoder 14. The data bus signal latch unit 17 stores the data bus signals gio<0:n> with its latch depending on the signal rs from the decoder 14 and then outputs a signal rdbl stored at the latch depending on the count pulses ts<0:n> from the counter 18. The select unit 15 selectively outputs one of the output signal rdbl from the data bus signal latch unit 17, the signal rdbc from the compression unit 16, and one signal gio<k> of the data bus signals gio<0:n> through the output terminal rdb depending on the data compression signal tcomp and the signal tsdout from the decoder 14.

Figure 6:
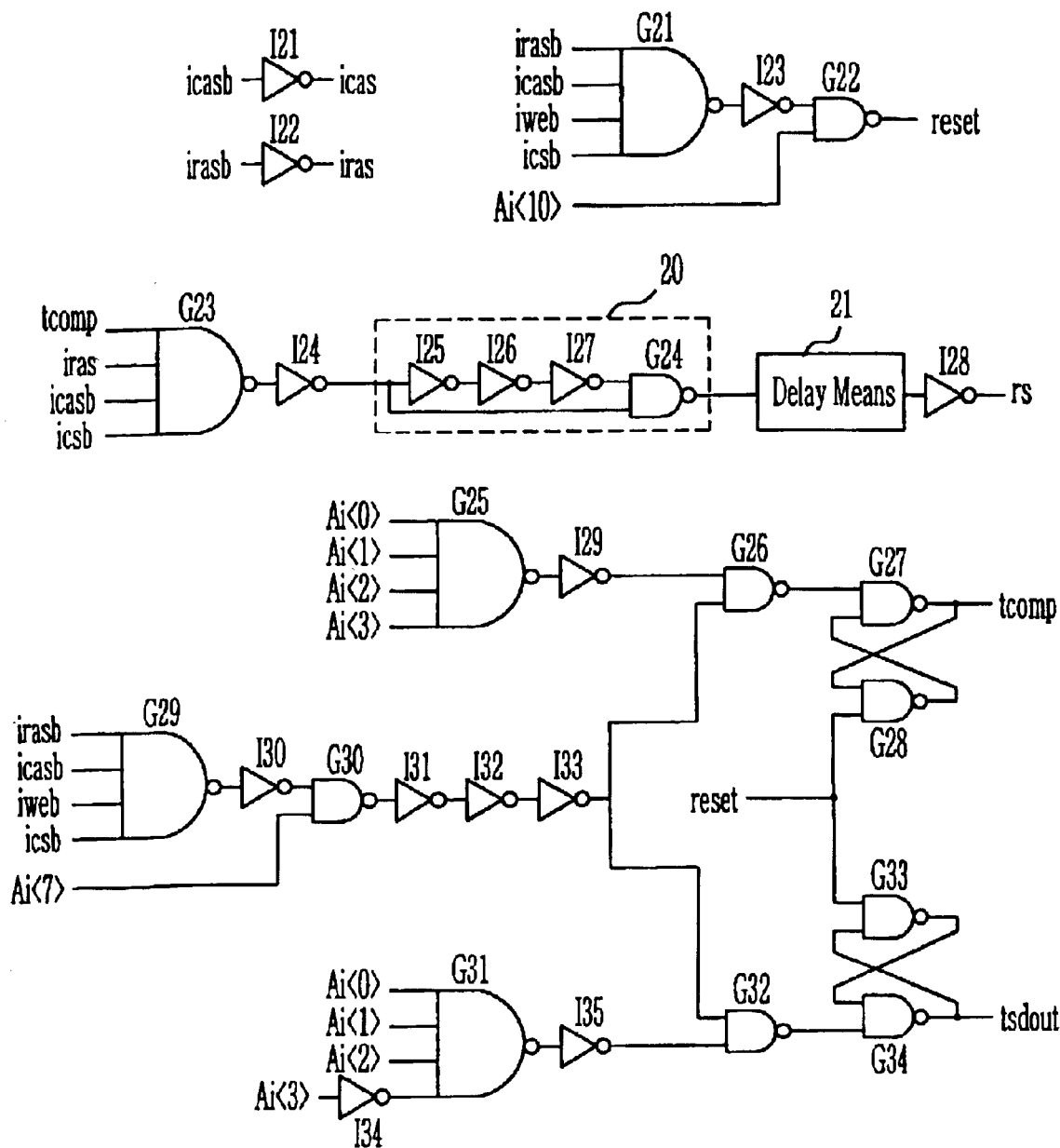
FIG. 6 is a detailed circuit diagram of a decoder shown in FIG. 5.

Referring now to FIG. 6, the decoder 14 shown in FIG. 5 will be described in detail. The inverters I21 and I22 output inverted signals icas and iras of the operation control signals icasb and irasb outputted from the latch unit 13, respectively. The NAND gate G21 receives the plurality of the operation control signals irasb, icasb, iweb and icsb from the latch unit 13. The NAND gate G22 receives an output signal of the NAND gates G21 that is inverted by the inverter I23, and the address signal Ai<10> to output a reset signal reset.

The NAND gate G23 receives the data compression signal tcomp outputted from the decoder 14, the output signal iras from the inverter I22, and the output signals icasb and icsb from the latch unit 13. An output signal of the NAND gate G23 is inputted to the inverter I24. An output signal of the inverter I24 is inputted to a delay means 20. The delay means 20 includes inverters I25, I26 and I27 for inverting an output signal of the inverter I24, and a NAND gate G24 for receiving an output signal of the inverter I24 and an output signal of the inverter I27. An output of the delay means 20 is delayed by the delay means 21 and is then outputted to an output terminal rs through the inverter I28.

The NAND gate G29 receives the plurality of the operation control signals irasb, icasb, iweb and icsb from the latch unit 13. The NAND gate G30 receives an output signal of the NAND gate G29 that is inverted by the inverter I30, and the address signal Ai<7>. An output signal of the NAND gate G30 is inverted through the inverters I31, I32 and I33. The NAND gate G25 receives the address signals Ai<0>, Ai<1>, Ai<2> and Ai<3>. Also, the NAND gate G26 receives an output signal of the NAND gate G25 that is inverted by the inverter I29, and an output signal of the inverter I33. The NAND gate G31 receives the address signals Ai<0>, Ai<1> and Ai<2>, and the address signal Ai<3> inverted by the inverter I34. The NAND gate G32 receives an output signal of the NAND gate G31 that is inverted by the inverter I35, and an output signal of the inverter I33. The latch circuit consisting of the NAND gates G27 and G28 outputs the data compression signal tcomp depending on an output signal of the NAND gate G26 and the reset signal reset. Further, the latch circuit consisting of the NAND gates G33 and G34 outputs the signal tsdout depending on an output signal of the NAND gate G32 and the reset signal reset.

When the plurality of the operation control signals irasb, icasb, iweb and icsb, and the address signals Ai<7>, Ai<0>, Ai<1> and Ai<2> are HIGH levels and the address signal Ai<3> is a LOW level, the signal tsdout becomes a HIGH level. When the signals irasb, iweb, icsb and Ai<10> are HIGH levels and the signal icasb is a LOW level, the signal tsdout becomes a LOW level.

When the signal tsdout is a HIGH level, a test mode by which data of plural bits are outputted through the data line of one bit. The decoding signal used to control the signal tsdout is illustrative and another decoding signal is possible.

The signal rs is an active HIGH pulse that is generated by making an active LOW pulse with an adequate width into a signal in which the signals icasb, ics are HIGH levels when the signal rs is a HIGH level. The signals icasb, ics become a HIGH signal when the signal irasb is a LOW level and then by delaying this pulse for a given time. The delay time of the delay means 21 is controlled so that data loaded onto the data bus signals gio<0:n> of plural bits can be stored at the latch lat<0:n> in FIG. 8 when the signals icasb and icsb are HIGH levels and the signal irasb is a LOW level.

Figure 7:
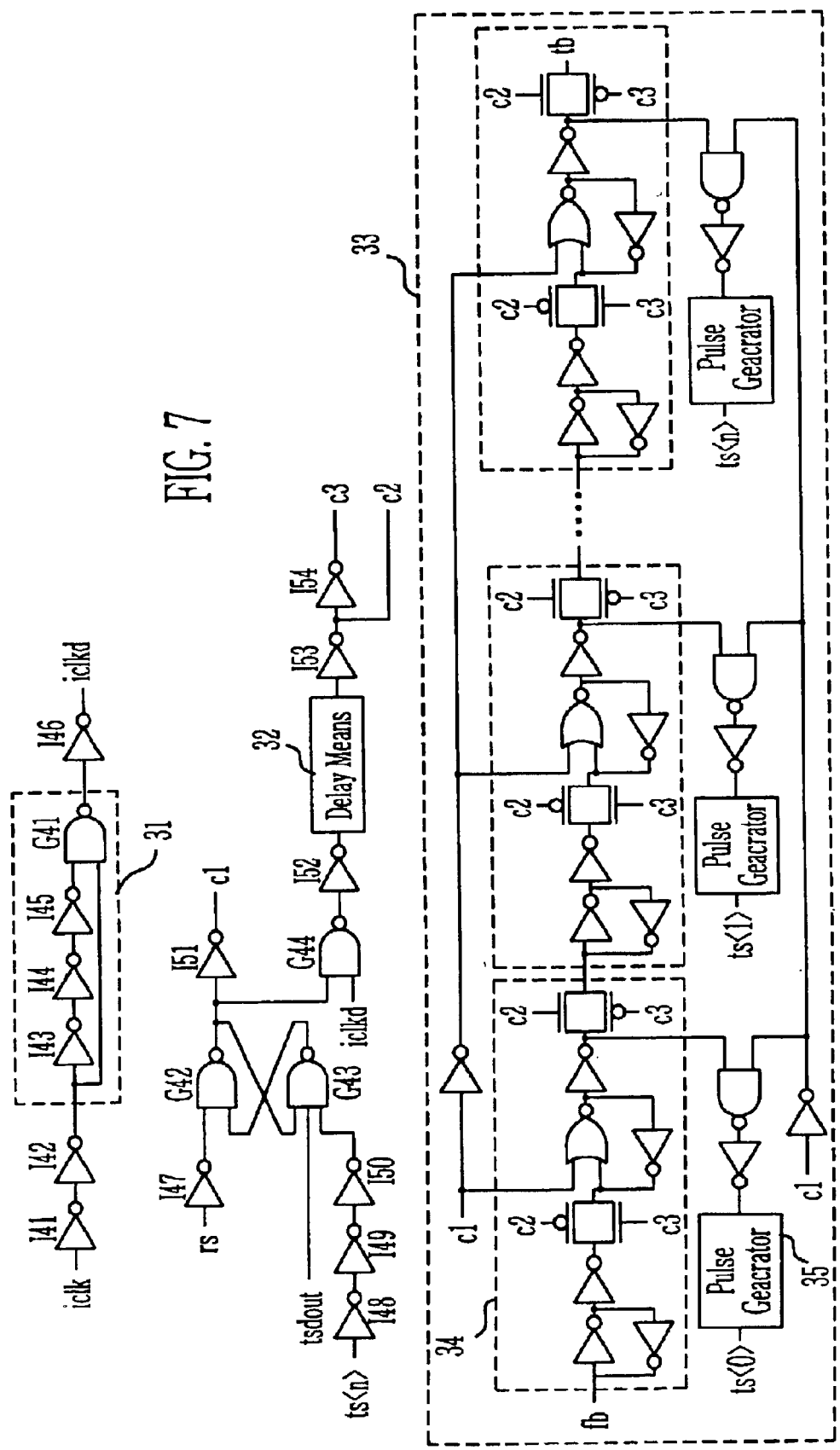
FIG. 7 is a detailed circuit diagram of a counter shown in FIG. 5.

FIG. 7 is a detailed circuit diagram of the counter 18 shown in FIG. 5. The clock signal iclk outputted from the clock buffer 11 is outputted to the output terminal iclkd through the inverters I41 and I42, the delay means 31 and the inverter I46. The delay means 31 includes inverters I43, I44 and I45 for inverting an output signal of an inverter I42, and a NAND gate G41 for receiving an output signal of the inverter I45 and an output signal of the inverter I42.

The latch circuit consisting of NAND gates G42 and G43 receives the signals rs and tsdout, and a signal ts<n> that is inverted by the inverters I48, I49 and I50. An output signal of the latch circuit is outputted to the output terminal c1 through an inverter I51. A NAND gate G44 receives an output signal of the latch circuit consisting of NAND gates G42 and G43 and the signal iclkd. An output signal of the NAND gate G44 is outputted to an output terminal c2 through an inverter I52, a delay means 32 and an inverter I53. An output signal of the inverter I53 is outputted to an output terminal c3 through an inverter I54.

A count pulse generator 33 is driven depending on the signals c1, c2 and c3. The count pulse generator 33 includes a plurality of signal transfer units 34 serially connected, and a plurality of pulse generators 35 for generating a pulse depending on a signal outputted from the signal transfer unit 34.

The signal iclkd is an active HIGH pulse that becomes a LOW pulse in which the clock signal iclk from the clock buffer 11 has an adequate width that is delayed by the delay means 31 and inverted by the inverter I46. If the signal rs becomes a HIGH level, the signal c1 becomes a LOW level. The signal iclkd is delayed for a given time and is then inverted to produce the signal c2. The signal c3 is an inverted signal of the signal c2.

In the signals ts<0:n>, if the signal tsdout is a HIGH level, wherein:

1) If the signal rs is outputted with a HIGH level from the decoder 14, the signal c1 becomes a LOW level to make only the count pulse ts<0> an active HIGH, 2) After the first step, if the signal iclkd becomes a HIGH level and a given time elapses, only the count pulse ts<1> becomes an active HIGH, and 3) After the second step, if the signal iclkd becomes a HIGH level and a given time elapses, only the count pulse ts<2> becomes an active HIGH, 4) After the first step, the signal iclkd becomes a HIGH level and a given time elapses, only the count pulse ts<3> becomes an active HIGH. In this manner, if the pulse is sequentially generated up to a n-th count pulse ts<n>, the signal c1 becomes a HIGH level so that generation of the count pulse ts<0:n> is stopped.

Figure 8:
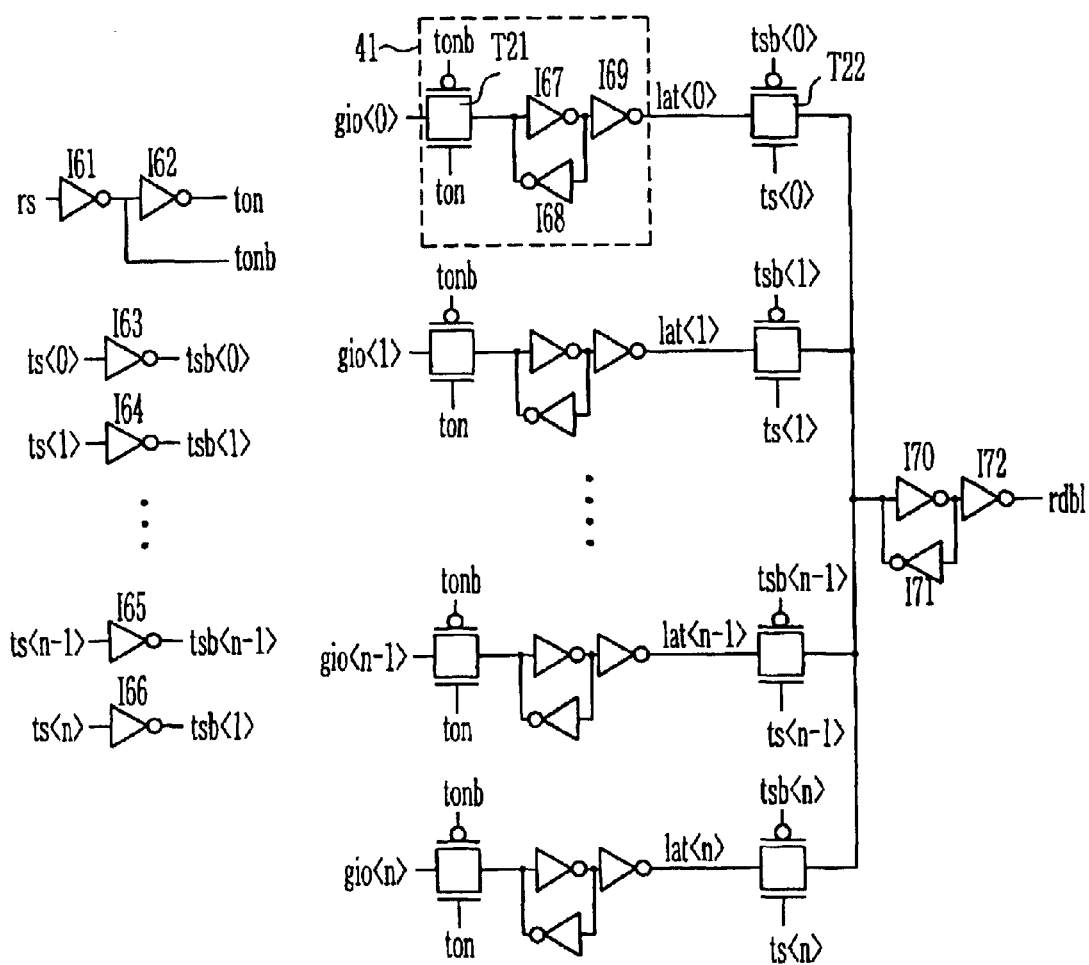
FIG. 8 is a detailed circuit diagram of a data bus signal latch shown in FIG. 5.

FIG. 8 is a detailed circuit diagram of the data bus signal latch unit 17 shown in FIG. 5. The inverter I61 outputs an inverted signal tonb of the signal rs outputted from the decoder 14. The inverter I62 outputs an inverted signal ton of the signal tonb. The inverter I63 outputs an inverted signal tsb<0> of the count signal ts<0>. In the same manner, the inverters I63 to I66 output inverted signals tsb<1> to tsb<n> of the count signals ts<1> to ts<n>.

The data bus signals gio<0> to gio<n> are inputted to the latch means (one shown as 41). A signal outputted from each of the latch means 41 is transferred to the output terminal rdbl sequentially through a transmission gate T22 driven depending on the count pulse ts<n> and the inverted count pulse tsb<n>, a latch having the inverters I70 and I71, and an inverter I72. Each of the latch means 41 includes a transmission gate T21 for receiving the data bus signals gio<0> to gio<n>, a latch connected to the transmission gate T21 and having inverters I67 and I68, and an inverter I69 connected to the latch.

If the signal rs becomes a HIGH level, data of the data bus signal gio<0:n> is stored at the latch means lat<0:n> 41. Next, the count signals ts<0:n> become sequentially a HIGH level, wherein:

1) If the count signal ts<0> becomes a HIGH level, data of the latch lat<0> is transferred to the output terminal rdbl, 2) If the count signal ts<1> becomes a HIGH level, data of the latch lat<1> is transferred to the output terminal rdbl, 3) If the count signal ts<2> becomes a HIGH level, data of the latch lat<2> is transferred to the output terminal rdbl, and 4) If the count signal ts<3> becomes a HIGH level, data of the latch lat<3> is transferred to the output terminal rdbl. In this manner, if a n-th count signal ts<n> becomes a HIGH level, data of the latch lat<n> is transferred to the output terminal rdbl.

Figure 9:
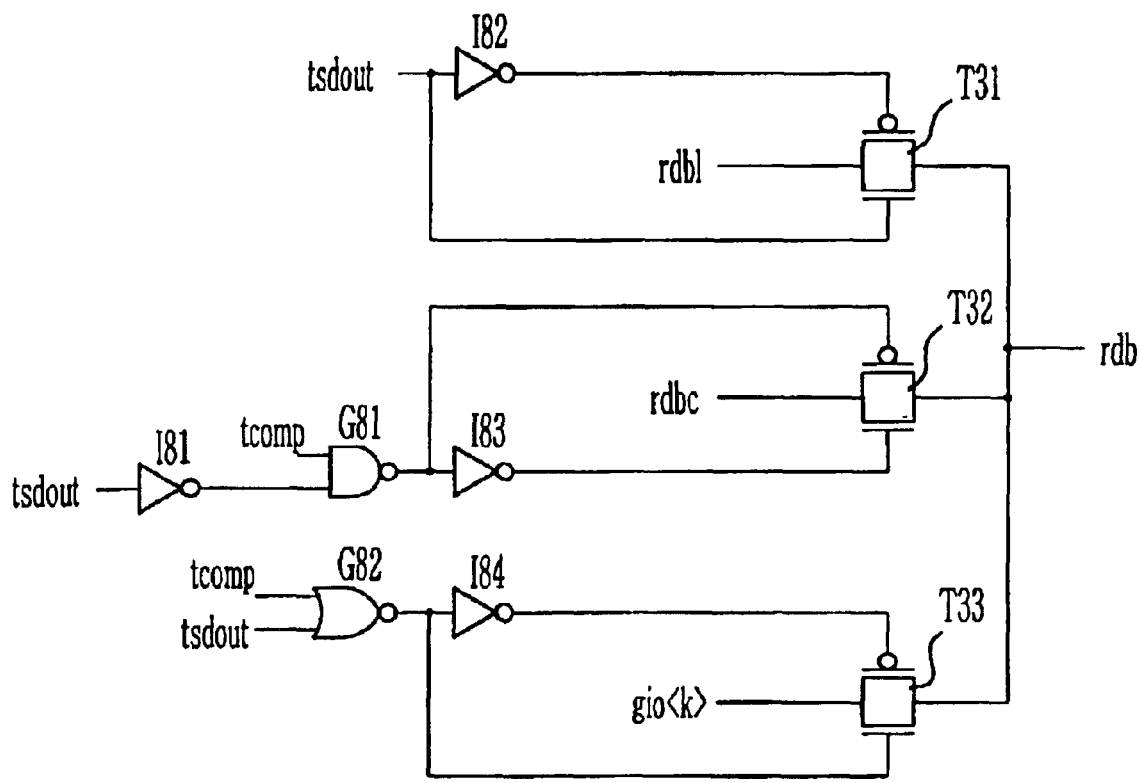
FIG. 9 is a detailed circuit diagram of a select unit shown in FIG. 5.

FIG. 9 is a detailed circuit diagram of the select unit 15 shown in FIG. 5. The NAND gate G81 receives the data compression signal tcomp outputted from the decoder 14, and the signal tsdout inverted by the inverter I81. The NOR gate G82 receives the data compression signal tcomp and the signal tsdout.

The signal rdbl outputted from the data bus signal latch unit 17 is transferred to the output terminal rdb based on an operation of the transmission gate T31, which is driven depending on the signal tsdout and the signal tsdout inverted by the inverter I82. The signal rdbc outputted from the compression unit 16 is transferred to the output terminal rdb based on an operation of the transmission gate T32, which is driven depending on an output signal of the NAND gate G81 and an output signal of the NAND gate G81 that is inverted by the inverter I83. The data bus signal gio<k> is transferred to the output terminal rdb based on an operation of the transmission gate T33, which is driven depending on an output signal of the NOR gate G82 and an output signal of the NOR gate G82 that is inverted by the inverter I84.

In other words, if the signal tsdout outputted from the decoder 14 is a HIGH level, the signal rdbl outputted from the data bus signal latch unit 17 is transferred to the output terminal rdb. If the signal tsdout is a LOW level and the data compression signal tcomp is a HIGH level, the signal rdbc is transferred to the output terminal rdb. If both the data compression signal tcomp and the signal tsdout are LOW levels, the data bus signal gio<k> is transferred to the output terminal rdb.

Figure 10B:
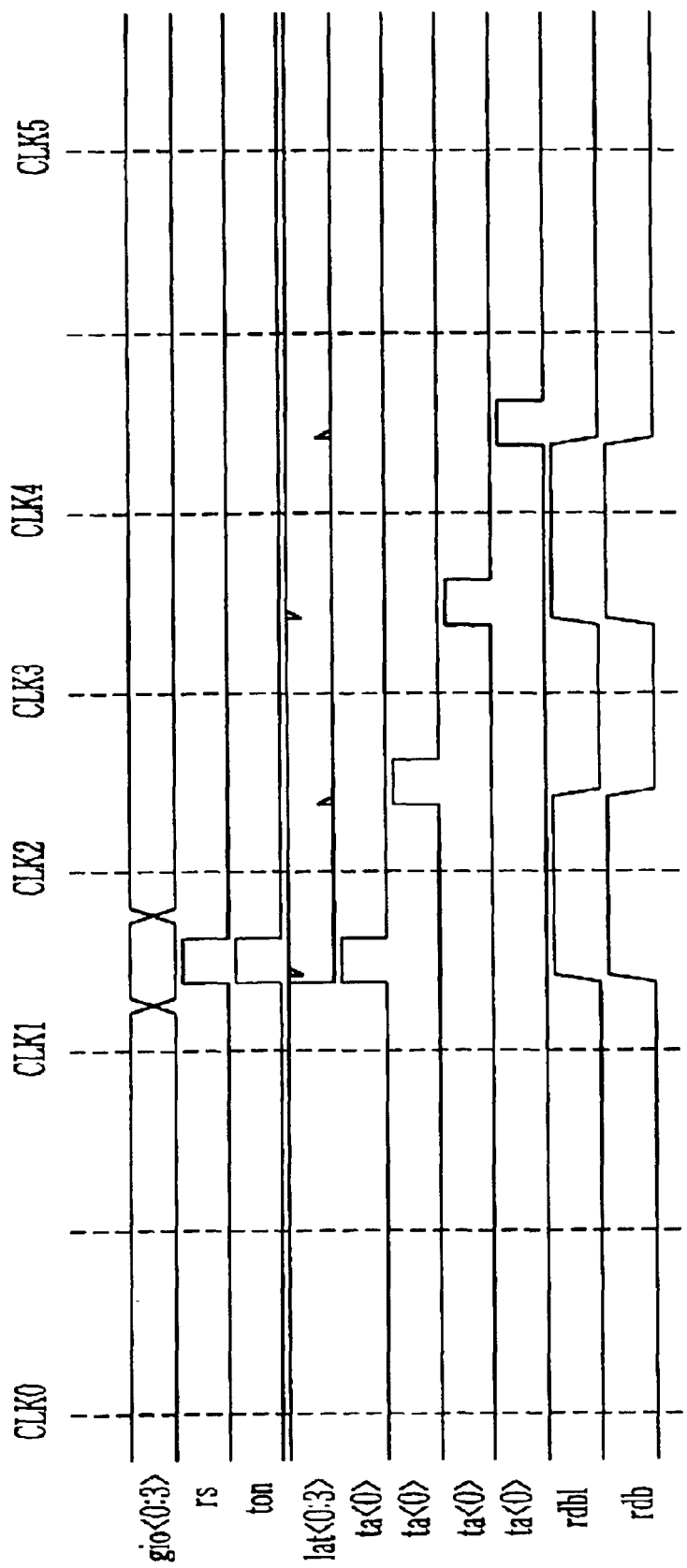

FIG. 10A and FIG. 10B are timing diagrams illustrating an operation of the data error inspecting circuit when n=3. In a clock CLKO in which the signals /RAS, /CAS, /WE, /CS and AN<3> inputted from the outside are LOW levels and the signals AN<0>, AN<1>, AN<2> and AN<7> are HIGH levels, if the signals irasb, icasb, iweb, icsb, Ai<0>, Ai<1>, Ai<2> and Ai<7> become HIGH levels and the signal Ai<3> becomes a LOW level, the output signal tsdout of the decoder 14 becomes a HIGH level.

In a clock CLK1 in which the signals /CAS and /CS are LOW levels and the signals /RAS and /WE are HIGH levels, if the signals icasb and icsb become HIGH levels and the signals irasb and iweb become LOW levels, data is loaded onto the data bus gio<0:3> depending on an internal operation of the DRAM. The data buses gio<0> and gio<2> are loaded with data of HIGH levels and the data buses gio<1> and gio<3> are loaded with data of LOW levels.

Further, the signal rs becomes an active LOW pulse and the data of the data bus gio<0:3> is stored at the latch lat<0:3>. The count pulse ts<0> becomes a HIGH level and data of the latch lat<0> is transferred to the output terminals rdbl and rdb.

In clocks CLK2, CLK3 and CLK4, the count pulses ts<1>, ts<2> and ts<3> sequentially become a HIGH level when a signal /CS of a HIGH level is inputted from the outside and the signal icsb becomes a LOW level. Thus, data of the latches lat<1>, lat<2> and lat<3> are transferred to the output terminals rdbl and rdb.

In a clock CLK5, the signals /RAS, /WE and /CS of LOW levels and the signals /CAS and AN<10> of HIGH levels are inputted from the outside. The signals irasb, iweb, icsb and Ai<10> become HIGH levels and the signal icasb becomes a LOW level. Therefore, the signal tsdout becomes a LOW level.

As mentioned above, data of N bits is sequentially transferred through a data line of one bit. Thus, a test mode by which information of each of the N bit data is transferred to the data transferred to the data line of one bit can be implemented. Accordingly, error in each of data of plural bits can be inspected with only data transferred through the data line of one bit without additional test environment. Thus, cost in facilitating error inspection can be reduced.

Many changes and modifications to the embodiments described herein could be made. The scope of some changes is discussed above. The scope of others will become apparent from the appended claims.

What is claimed is:

1. A circuit for inspecting a data error, the circuit comprising:
   a clock buffer configured to receive a clock signal;
   a buffer unit configured to receive a plurality of operation control signals and an address signal;
   a latch unit configured to synchronize the plurality of the operation control signals and the address signal from the buffer unit depending on the clock signal from the clock buffer;
   a decoder configured to receive the plurality of the operation control signals and the address signal from the latch unit to output a data compression signal, a first signal, and a second signal;
   a compression unit configured to compress the data bus signal based on the data compression signal from the decoder;
   a counter configured to sequentially generate count pulses based on the clock signal from the clock buffer, and the first signal and the second signal from the decoder;
   a data bus signal latch unit having a latch configured to store the data bus signal based on the first signal from the decoder, the data bus signal latch unit configured to output a signal stored at the latch based on the count pulses from the counter; and
   a select unit configured to selectively output one of an output signal of the data bus signal latch unit, a signal from the compression unit and the data bus signal based on the data compression signal and the second signal outputted from the decoder.

2. The circuit as claimed in claim 1, wherein the decoder includes:
- a first logic circuit configured to logically combine the plurality of the operation control signals and the address signal outputted from the latch unit to generate a reset signal;
- a second logic circuit configured to logically combine the plurality of the operation control signals from the latch unit;
- a delay unit configured to delay a signal from the second logic circuit to generate a first signal;
- a third logic circuit configured to logically combine the address signal from the latch unit;
- a fourth logic circuit configured to logically combine the plurality of the operation control signals and the address signal from the latch unit and then delay the logically combined signals;
- a fifth logic circuit configured to logically combine the address signal from the latch unit; and
- a sixth logic circuit configured to generate the data compression signal and the second signal based on a signal outputted from the third, fourth and fifth logic circuits and the reset signal.

3. The circuit as claimed in claim 1, wherein the counter includes:
- a delay circuit configured to delay a clock signal from the clock buffer;
- a logic circuit configured to logically combine the first and second signals from the decoder and the clock signal from the delay circuit to generate first, second and third signals; and
- a count pulse generator configured to generate a count pulse based on the first, second and third signals.

4. The circuit as claimed in claim 3, wherein the count pulse generator includes:
- a plurality of signal transfer units serially connected, the plurality of signal transfer units configured to transfer a signal based on the first, second and third signals; and
- a pulse generator configured to sequentially generate the count pulse based on a signal from each of the plurality of signal transfer units.

5. The circuit as claimed in claim 1, wherein the data bus signal latch unit includes:
- a logic circuit configured to generate first and second signals of opposite state of each other using the first signal from the decoder;
- a plurality of inverters configured to invert each of the plurality of the count signals from the counter;
- a plurality of latch unit configured to latch each of the data bus signals based on the first and second signals from the logic circuit; and
- a plurality of transfer units configured to transfer the data bus signals latched in the latch unit to an output terminal based on a count signal from the counter and an inverted count signal from one of the plurality of inverters.

6. The circuit as claimed in claim 1, wherein the select unit includes:
- a first transfer unit configured to transfer an output signal of the data bus signal latch unit to an output terminal based on the second signal and the inverted second signal;
- a first logic circuit configured to logically combine the data compression signal and the inverted second signal;
- a second transfer unit configured to transfer an output signal of the compression unit to the output terminal based on an output signal of the first logic circuit and an inverted output signal of the first logic circuit;
- a second logic circuit configured to logically combine the data compression signal and the second signal; and
- a third transfer unit configured to transfer the data bus signal to the output terminal based on an output signal of the second logic circuit and an inverted output signal of the second logic circuit.

* * * * *